(12) United States Patent
Wu

(10) Patent No.: US 10,690,332 B1
(45) Date of Patent: Jun. 23, 2020

(54) LIGHTING FIXTURE AND POWER CHAMBER THEREOF

(71) Applicant: Huizhou Hanxing Optoelectronic Co., Ltd, Huizhou (CN)

(72) Inventor: Hongge Wu, Huizhou (CN)

(73) Assignee: HUIZHOU HANXING OPTOELECTRONIC CO., LTD., Huizhou (CN)

( * ) Notice: Subject to any disclaimer, the term of this patent is extended or adjusted under 35 U.S.C. 154(b) by 0 days.

(21) Appl. No.: 16/455,499

(22) Filed: Jun. 27, 2019

(30) Foreign Application Priority Data

May 31, 2019 (CN) .......................... 2019 1 0471272

(51) Int. Cl.
| | | |
|---|---|---|
| *F21V 23/02* | (2006.01) | |
| *F21V 29/508* | (2015.01) | |
| *H05K 5/02* | (2006.01) | |
| *F21V 31/00* | (2006.01) | |
| *F21W 131/10* | (2006.01) | |
| *F21V 17/10* | (2006.01) | |
| *F21V 15/01* | (2006.01) | |

(52) U.S. Cl.
CPC .......... *F21V 23/023* (2013.01); *F21V 29/508* (2015.01); *F21V 31/005* (2013.01); *H05K 5/0217* (2013.01); *F21V 15/01* (2013.01); *F21V 17/10* (2013.01); *F21V 17/104* (2013.01); *F21W 2131/10* (2013.01)

(58) Field of Classification Search
CPC .... F21V 23/023; F21V 29/508; F21V 31/005; F21V 17/10; F21V 17/104; F21V 15/01; F21W 2131/10; F21W 2131/103; H05K 5/0217
See application file for complete search history.

(56) References Cited

U.S. PATENT DOCUMENTS

| | | | |
|---|---|---|---|
| 7,798,670 B2 | 9/2010 | Kinnune | |
| 2008/0078524 A1* | 4/2008 | Wilcox | ................... F21S 2/005 165/11.1 |
| 2008/0080196 A1* | 4/2008 | Ruud | ..................... F21S 2/005 362/373 |
| 2009/0161371 A1* | 6/2009 | Vukosic | ............... B60Q 1/2611 362/373 |

(Continued)

FOREIGN PATENT DOCUMENTS

| | | |
|---|---|---|
| CN | 106322267 A | 1/2017 |
| CN | 107975734 A | 5/2018 |

*Primary Examiner* — Zheng Song
(74) *Attorney, Agent, or Firm* — Hemisphere Law, PLLC; Zhigang Ma

(57) ABSTRACT

A power chamber of a lighting fixture includes a chamber body receiving at least one power module. One of the power module and the chamber body includes a first fixing plate defining a sliding groove sunken inwards from a surface of the first fixing plate. The other one of the power module and the chamber body includes a fastener whose end is matched with the sliding groove. The power module and the chamber body are connected together through the fastener which is inserted into the sliding groove, therefore simple to assemble and disassemble. The power chamber can be a profile structure with low manufacturing costs. Power chamber cover(s) can be arranged on the side of the lighting fixture and can be integrally molded with pipes used for fixing the light source module.

8 Claims, 5 Drawing Sheets

(56) References Cited

U.S. PATENT DOCUMENTS

| | | | |
|---|---|---|---|
| 2012/0113634 A1* | 5/2012 | Wong | F21V 21/005 362/235 |
| 2013/0027936 A1* | 1/2013 | Ladewig | F21S 2/00 362/249.01 |
| 2014/0104836 A1* | 4/2014 | Kinnune | F21V 29/74 362/249.02 |
| 2018/0231230 A1* | 8/2018 | Kim | F21V 29/713 |

* cited by examiner

LIGHTING FIXTURE AND POWER CHAMBER THEREOF

CROSS-REFERENCE TO RELATED APPLICATIONS

This application claims priority benefit of Chinese Application 201910471272.2, filed on May 31, 2019, said application being fully incorporated by reference herein.

BACKGROUND OF THE INVENTION

1. Field of the Invention.

The invention relates to a lighting fixtures and particularly relates to a lighting fixture suitably used outdoors and a power chamber of the lighting fixture.

2. Description of Related Art

Lighting fixtures suitably used outdoors are generally equipped with at least one power module. The power module can be externally arranged on a lamp pole or can be arranged in a power distribution box at a lower part of the lamp pole, and can also be fixed in a power chamber of the lighting fixtures. When the power module is arranged in the power chamber of the lighting fixture, in order to conveniently fix the power module, the opening of the power chamber is generally designed on the front (the side from which light is transmitted) or the back of the lamp; a plurality of convex cylinders or lug bosses are formed in the power chamber; screw holes are formed in the convex cylinders or lug bosses and used for fixing the power module on the convex cylinders or the lug bosses by means of a plurality of bolts, for example, as disclosed in an LED street lamp disclosed by a Chinese invention patent with an application number of 201510597049.4 and an application date of Sep. 17, 2015. However, this fixing manner has the following disadvantages: the power module is inconveniently to assemble, replace or remove, and a large number of bolts need to be fixed or removed; because a plurality of convex cylinders or lug bosses need to be designed in the power chamber, the power chamber cannot be manufactured by a profile, the mold manufacturing cost is relatively high; and the large size of the cover body of the power chamber leads to a lot of positions in want of waterproof.

Brian Kinnune (U.S. Pat. No. 7,798,670B2, Pub. Date Sep. 21, 2010) discloses a power supply mounting apparatus for a lighting fixture, as disclosed in column 10, lines 39-67, and shown in FIGS. 16-18, the lighting fixture 120 includes a chamber 124 defined by a surrounding wall 121, at least one power-supply unit 126 within chamber 124, and a slidable interlock 127 securing the power-supply unit 126 to surrounding wall 121. The interlock 127 includes a linear groove 128 on wall 121 and a mating projection 129 on a mounting member 125 which is affixed to the power-supply unit 126. The projection 129 is slidably receivable into groove 128. However, the projection 129 of Brian Kinnune is a linear projection projected from the mounting member 125 and is very long. It is not easy to be configured on a case of a power supply, so the mounting member 125 is needed.

BRIEF DESCRIPTION OF THE SEVERAL VIEWS OF THE DRAWING(S)

The foregoing and other exemplary purposes, aspects and advantages of the present invention will be better understood in principle from the following detailed description of one or more exemplary embodiments of the invention with reference to the drawings, in which.

DETAILED DESCRIPTION OF THE INVENTION

The invention will now be described in detail through several embodiments with reference to the accompanying drawings.

Figure 1:
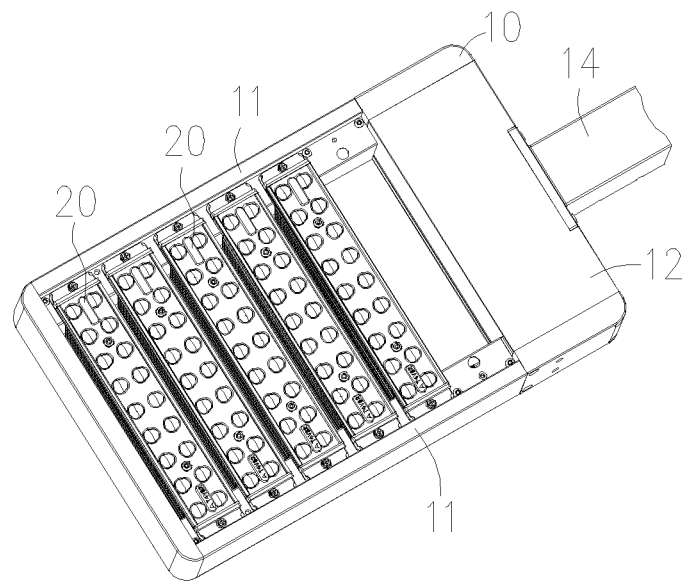
FIG. 1 is a perspective view of a lighting fixture in accordance with a first embodiment, wherein one light source module is removed.
Figure 2:
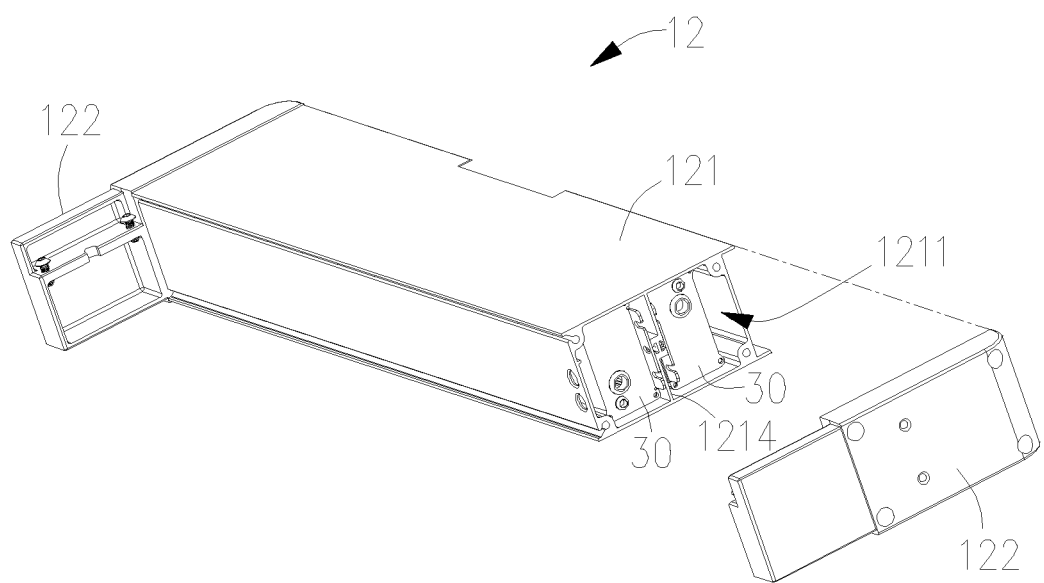
FIG. 2 is an exploded view of a power chamber of the lighting fixture in FIG. 1.
Figure 3:
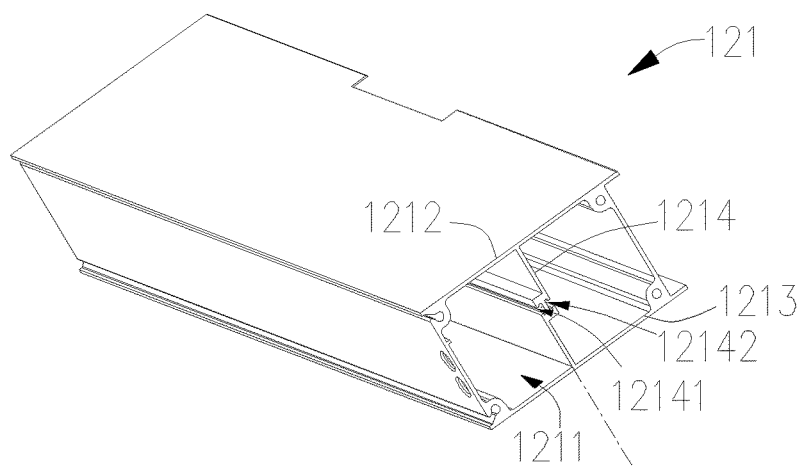
FIG. 3 is a perspective view of a chamber body of the power chamber and three power modules in the chamber body in FIG. 2.
Figure 4:
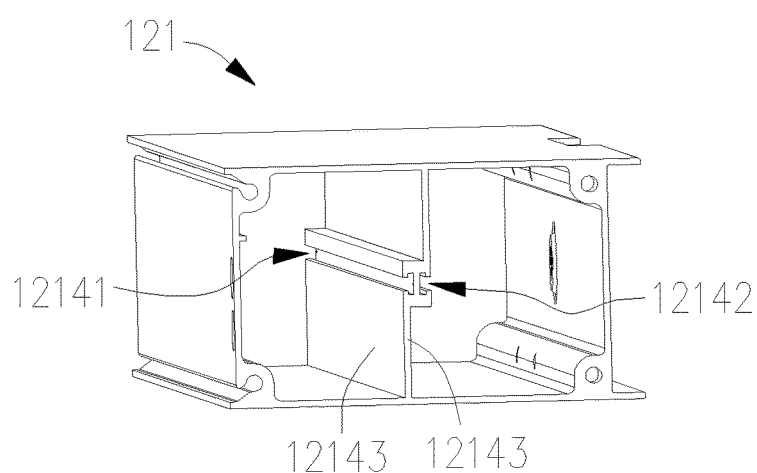
FIG. 4 is a perspective view of the power chamber in another view in FIG. 3.
Figure 5:
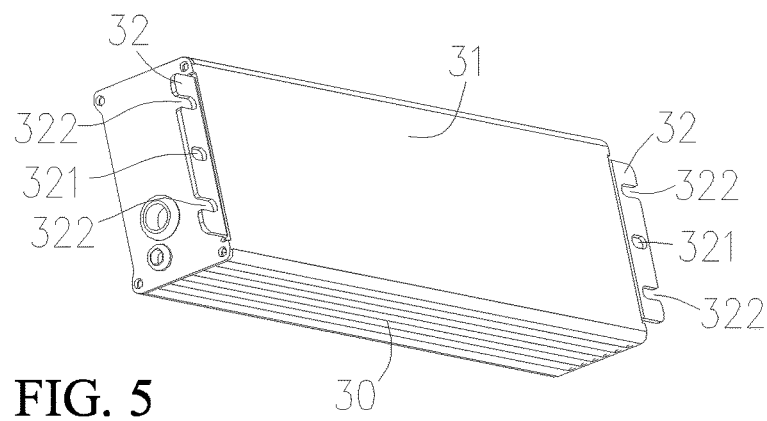
FIG. 5 is a perspective view of the power module in another view in FIG. 3.
Figure 6:
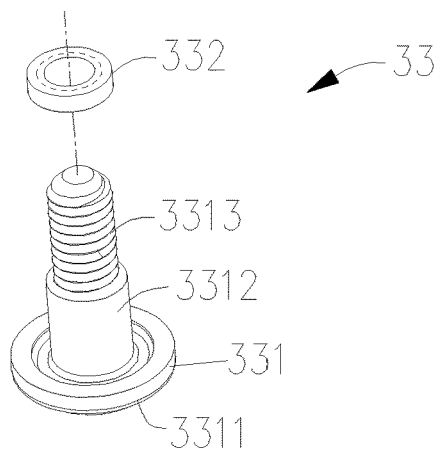
FIG. 6 is a perspective view of a fastener in the first embodiment.

With reference to FIG. 1, a lighting fixture in a first embodiment mainly includes a bracket 10 and at least one light source module 20 assembled on an inner side of the bracket 10. The lighting fixture as shown in FIG. 1 includes six light source modules 20, and one of the six light source modules 20 is removed in order to conveniently observe the bracket 10. The light source modules 20 are modular and can be fixed between two fixing tubes 11 in the bracket 10 in parallel. Different numbers of light source modules may be arranged so as to constitute lighting fixtures with different sizes and different power according to demand in use.

Thereinafter, in order to conveniently describe, one side of a light outgoing direction of the lighting fixture is front/head of the lighting fixture, and the other side facing away from the light outgoing direction is back/rear.

Besides the fixing tubes 11, the bracket 10 also includes a power chamber 12 fixed at one ends of the fixing tubes 11, an end cover 13 fixed at the other ends of the fixing tubes 11 and a lamp arm 14 connected to the power chamber 12.

The power chamber 12 is used for receiving power modules 30 which are electrically connected with the light source modules 20. The power chamber 12 includes a chamber body 121 defining two openings 1211 at its two ends and two power chamber covers 122 used for sealing the openings 1211. The two openings 1211 permit the power modules 30 to pass through. With reference to FIGS. 2-6 in the embodiment, the chamber body 121 is integrally manufactured by an aluminum alloy profile, is substantially shaped as a rectangular tube and includes two groups of outer walls opposite to each other and a first fixing plate 1214 which is connected between one group of outer walls 1212 and 1213 opposite to each other. The openings 1211 are formed in two ends of the chamber body 121, so that the chamber body is equipped with two power chamber covers 122. The power chamber covers 122 also includes tube parts extending towards the fixing tubes 11; the tube parts are inserted into the fixing tubes 11 and are fixedly connected with the fixing tubes 11 through bolts.

The first fixing plate 1214 is used for dividing an inside of the chamber body 121 into two spaces capable of respectively receiving the power modules 30. In the embodiment, a total of three power modules 30 are arranged in the power chamber 12; two power modules are fixed on one side of the first fixing plate 1214, and the other power module is fixed on the other side of the first fixing plate 1214.

Sliding grooves 12141 and 12142 sunken downwards from surfaces are respectively formed in the two surfaces of the first fixing plate 1214. The sliding grooves 12141 and 12142 penetrate through side walls 12143 (namely two side walls are first side walls) of two ends of the first fixing plate 1214, so that inlets for insertion of the sliding grooves are respectively formed in the side walls. A size of groove openings of the sliding grooves 12141 and 12142 is smaller than a size of groove bottoms of the sliding grooves. In other words, edges of each sliding groove cover a part of each groove, therefore the sliding grooves are T-shaped when observing an inside of the chamber body through the openings 1211. Extending directions of the sliding grooves are consistent with an extending direction of a profile and are parallel to the outer walls 1212 and 1213, so that the power modules 30 are parallel to the outer walls of the chamber body after the power modules are fixed.

In the embodiment, each power module 30 includes a substantially rectangular outer box; one outer wall 31 which is named a first outer wall of the outer box is used as a heat conduction plate and is in close contact with at least one part of the first fixing plate 1214 after the power module 30 is fixed into the power chamber 12, so that heat generated by the power module 30 is conducted to the power chamber 12, and the heat is dissipated outwards by the power chamber 12, namely, the power chamber 12 can be simultaneously used as a heat dissipation device and an outer case of the power module.

Each power module 30 also includes two second fixing plates 32 which respectively extend from two sides of the outer wall 31 towards an outer side; and the second fixing plates 32 and the outer wall 31 are basically located in the same plane. Understandably, the outer wall 31 can be integrally molded with the fixing plates 32; the fixing plates 32 can also extend out of other outer walls connected with the outer wall 31 or can be used as independent parts fixed on the outer wall of the power module. A first through hole 321 is formed in each second fixing plate 32; notches 322 penetrating through the edge of each second fixing plate are respectively formed in two sides of the first through hole 321. Understandably, through holes can also be used for replacing the notches 322.

A bolt 331 and a nut 332 used as fasteners 33 are fixed on each second fixing plate 32 through each first through hole 321. Each bolt 331 includes a bolt cap 3311, a smooth rod 3312 extending from a center of the back of the bolt cap and not provided with threads on an outer circumference, and a screw 3313 extending from a tail end of the smooth rod and provided with threads on an outer circumference. Each nut 332 is matched with each screw 3313; threads are formed in an inner circumference of each nut. A distance between each screw 3313 and each bolt cap 3311 is equal to or slightly greater than the sum of thickness of the second fixing plates 32 and thickness of sliding groove edges for covering the groove bottoms of the sliding grooves. Thus, when the nuts 332 are screwed to bottom ends of the screws 3313, the edges of the sliding grooves are tightly clamped with the second fixing plates, so that the outer walls 31 and the second fixing plates 32 of the power modules are tightly in contact with the first fixing plate 1214 of the power chamber 12 so as to ensure good heat conductivity.

In addition, the outer diameter of the smooth rods 3312 is greater than the outer diameter of the screws 3313 and is also greater than the diameter of the first through holes 321. The outer diameter of the screws 3313 is smaller than or equal to that of the groove openings of the sliding grooves 12141 and 12142; the size of the bolt caps 3311 of the bolts is greater than that of the groove openings of the sliding grooves 12141 and 12142, and the bolts can be received in the grooves of the sliding grooves.

When fasteners 33 are fixed on the second fixing plate 32, the bolt caps 3311 faces to one side of the first fixing plate 1214. In other words, an end (the bolt cap) of the fastener 33 protrudes out from the first fixing plate 1214. When assembling, each fastener 33 is firstly fixed on each second fixing plate 32 of each power module 30, so that each bolt cap protrudes out from the first fixing plate 1214 and faces to the outer side. Then, the power modules 30 are inserted into the openings 1211 of the power chamber 12, so that the ends which are the bolt caps 3311 of the fasteners 33 are inserted into the inlets of the sliding grooves 12141 or 12142; the first fixing plate 1214 and the second fixing plates 32 contact with each other; the power modules are pushed to slide the bolt caps 3311 of the bolts 331 in the sliding grooves; finally, the overall power modules are inserted into the openings 1211.

In order to prevent the power modules 30 from sliding in the power chamber 12, bolts can be screwed into positions corresponding to the notches 322 of the power modules 30 on the first fixing plate, so that the power modules 30 cannot slide out of the power chamber through the openings 1211. The notches 322 can also be C-shaped, so that the bolts are screwed into the notches; the bolts are inserted into the notches 322 so as to completely position the power modules 30.

Figure 9:
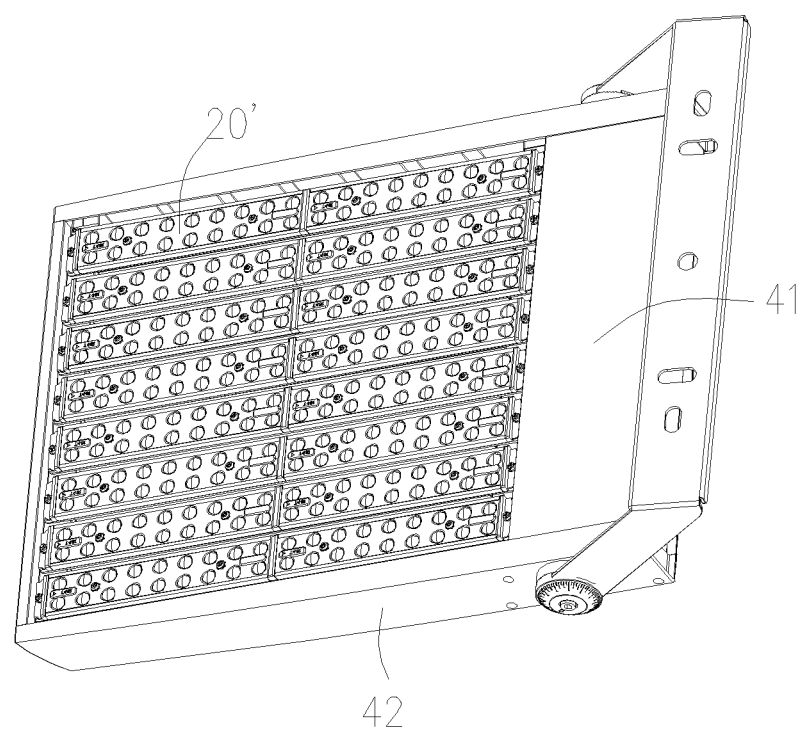
FIG. 9 is a schematic perspective view of a lighting fixture in accordance with another embodiment.

Thus, the sliding grooves and the fasteners matched with the sliding grooves are arranged, so that the power modules are slidably/removably connected to the power chamber. The power modules and the power chamber can be fastened and limited by needing one or two bolts at most, so that the power modules and the power chamber are extremely conveniently assembled and disassembled. In addition, the chamber body of the power chamber can be a profile and can be more simply and conveniently manufactured. When the length of the power chamber needs to be changed, a mold does not need to be additionally manufactured. The size of the power chamber covers is smaller and fewer positions need to be sealed when being compared with those the openings are formed in the front or the back of the lamp. Meanwhile, the power chamber covers are arranged on the sides of the lighting fixture, so that the power chamber covers can be integrally molded with the fixing tubes capable of fixing the light source modules (with reference to the lighting fixture of FIG. 9, the power chamber covers 42 of the power chamber 41 can be simultaneously used as the fixing tubes of light source modules 20').

In addition, in order to improve the heat conduction capability and the strength of the first fixing plate 1214, the thickness of parts with the sliding grooves 12141 and 12142 on the first fixing plate 1214 is greater than the thickness of parts without the sliding grooves on the first fixing plate, therefore both opposite surfaces of the first fixing plate 1214 are step-shaped. One part of the outer wall 31 and the second fixing plates 32 of each power module 30 is in contact with a higher step-shaped step surface, so that heat conduction is achieved.

Figure 7:
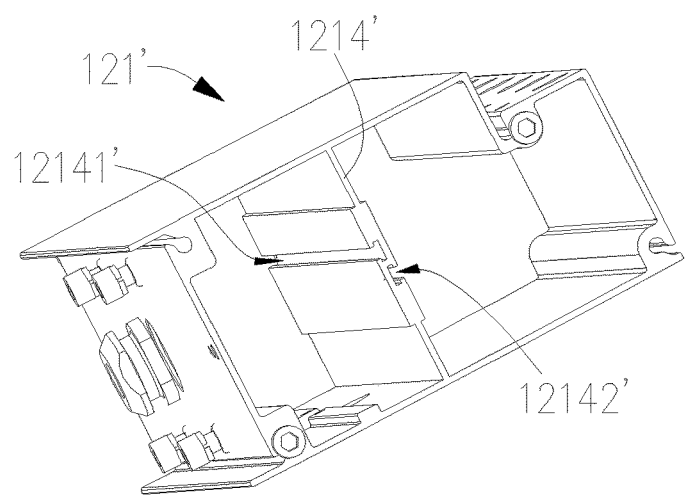
FIG. 7 is a perspective view of a chamber body of a power chamber of a lighting fixture in accordance with a second embodiment.

In the embodiment, the two sliding grooves 12141 and 12142 are opposite to each other and are coincident. In a second embodiment as shown in FIG. 7, the difference between the power chamber body 121' of the lighting fixture and the power chamber body 121 of the first embodiment mainly lies in that two sliding grooves 12141' and 12142' in a fixing plate 1214' of a chamber body 121' are arranged on two surfaces of the first fixing plate 1214' in a staggering manner, so that the thickness of the parts with the two sliding grooves 12141' and 12142' can be reduced.

Figure 8:
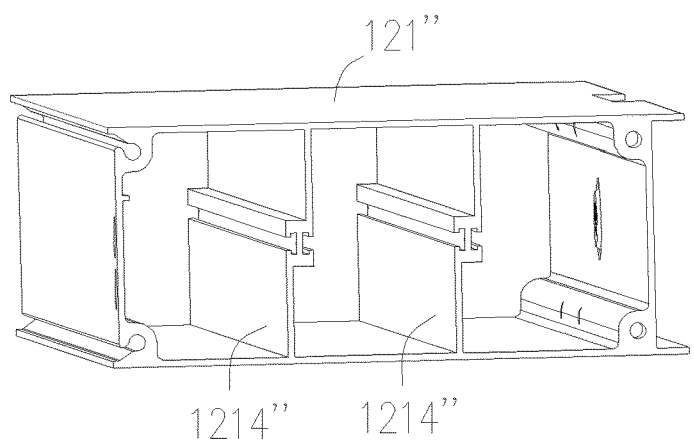
FIG. 8 is a perspective view of a chamber body of a power chamber of a lighting fixture in accordance with a third embodiment.

In the first and the second embodiments, one first fixing plate 1214/1214' is arranged in the chamber body 121/121' of the power chamber of the lighting fixture. In a third embodiment as shown in FIG. 8, the difference between a chamber body 121" of the power chamber of the lighting fixture and the power chamber body 121 of the first embodiment mainly lies in that two parallel first fixing plates 1214" similar to the chamber body 121 are arranged in the chamber body 121", so that more power modules can be fixed.

In other embodiments, the fasteners can only include bolts, the nuts are omitted; inner threads are formed in the first through holes. The bolts are directly screwed in the first through holes.

In other embodiments, the smooth rods on the bolts which are used as the fasteners can be omitted, namely the bolts only include screws and bolt caps.

In other embodiments, the outer diameter of the smooth rods of the bolts used as the fasteners is as same as that of the screws, so that the bolts can protrude out of the surface of the first fixing plate as little as possible before assembling, and transportation is facilitated.

In the embodiment, the sliding grooves are formed in the two surfaces of the first fixing plate. Understandably, in other embodiments, only one of the two surfaces of the first fixing plate is provided with one sliding groove or multiple sliding grooves parallel to each other, and the other surface of the first fixing plate is not provided with the sliding groove.

Figure 10:
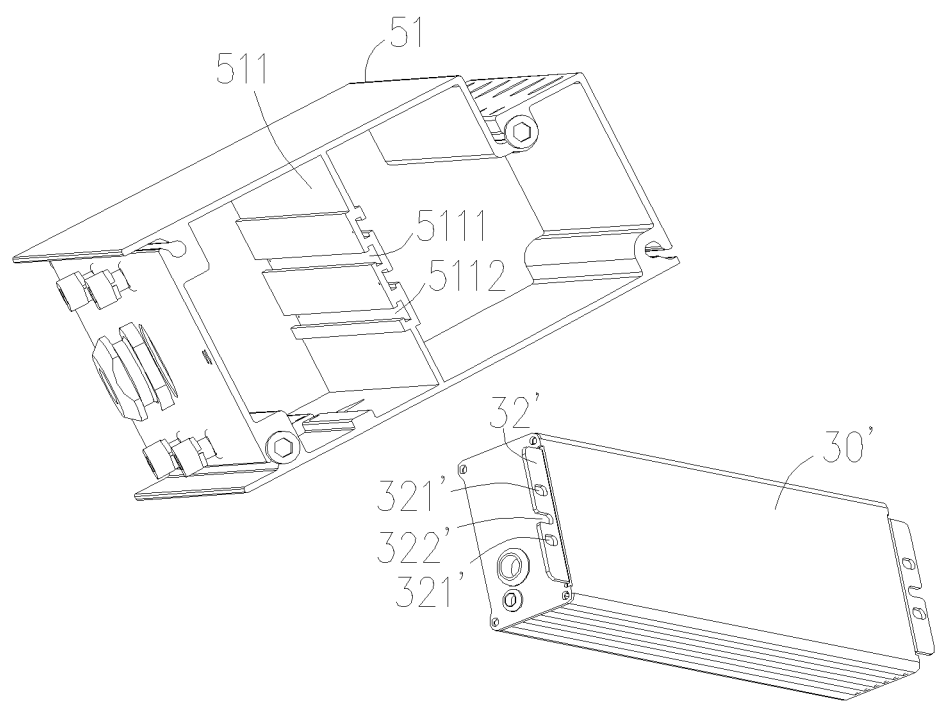
FIG. 10 is a schematic perspective view of a chamber body of a power chamber and a power module of a lighting fixture in accordance with a fourth embodiment.

As shown in FIG. 10 in a fourth embodiment as an variant embodiment of the second embodiment, two first through holes 321' are formed in a second fixing plate 32' of each power module 30'; correspondingly, two sliding grooves 5111 and 5112 used for fixing the power modules are formed in one surface of a first fixing plate 511 of a power chamber 51. Only one notch 322' can be formed in each second fixing plate.

In other embodiments, the fasteners can be parts which are integrally molded on the second fixing plates of the power modules. For example, a rectangular metal sheet is substantially vertically bent out of each second fixing plate; a free end of the rectangular metal sheet is divided into two parts which are respectively bent to two sides of the rectangular metal sheet, so that the metal sheet is T-shaped and can be inserted into a sliding groove so as to fix the power modules on the first fixing plate in the power chamber.

In the embodiment, the first fixing plate is arranged in the chamber body 121 and is used for dividing the inner space of the chamber body into two parts. Understandably, in other embodiments, the first fixing plate can be used as one side wall of the chamber body 121, so that only one space is used for fixing the power modules in the chamber body.

Figure 11:
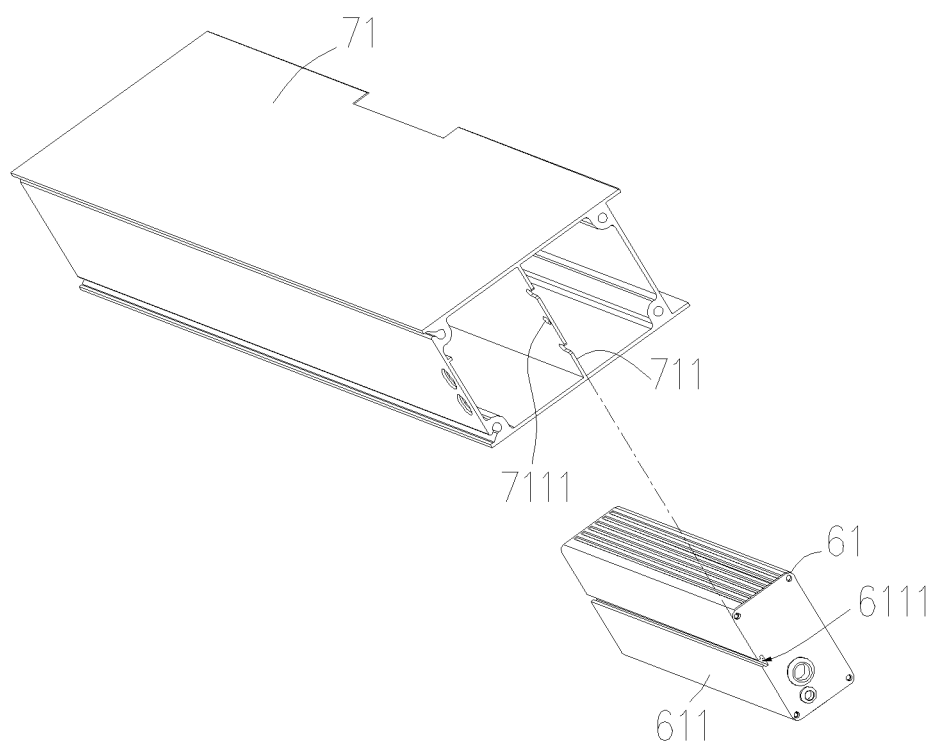
FIG. 11 is a schematic perspective view of a chamber body of a power chamber and a power module in accordance with a lighting fixture of a fifth embodiment.

In the embodiment, the first fixing plate is arranged on the power chamber; the second fixing parts are arranged on the power modules. Understandably, as show in FIG. 11 in a fifth embodiment as a variant embodiment of the first embodiment, a first fixing plate 611 can be arranged on a power module 61, and a second fixing plate 711 is arranged on a power chamber 71. Thus, a first fixing plate 611 with a sliding groove 6111 can be used as one outer wall of the power module 61; the second fixing plate 711 can also be used as one inner wall of the power chamber 71; a fastener (not shown in the drawing) similar to the fastener 33 in the first embodiment is fixed in a first through hole 7111 of the second fixing plate 711. The power module and the power chamber can be connected together by sliding the fastener into the sliding groove 6111 of the power module 61.

Understandably, the bolts in the above description are preferably fixed by spacers or gaskets; meanwhile, surfaces in contact with mounting surfaces of the spacers or the gaskets are preferably matched with the mounting surfaces, so that the connection strength is improved.

Understandably, waterproof rubber rings are arranged between the power chamber covers and the edges of the openings of the chamber body in the above description; all wire holes used for wiring and fixing holes used for connecting the bolts are formed in the outer wall of the power chamber and are sealed by rubber rings or rubber plugs.

The power module and the power chamber of the lighting fixture are connected together through the sliding groove and the fastener and are simple to assemble and disassemble. Except the power chamber cover, the power chamber can be a profile structure with low manufacturing costs. The size of the power chamber cover may be slightly larger than the size of the narrowest end of the power module, and few positions need to be sealed. The power chamber cover can be arranged on the side of the lamp and can be integrally molded with a pipe fitting for fixing a light source module.

While the invention has been described in terms of several exemplary embodiments, those skilled on the art will recognize that the invention can be practiced with modification within the spirit and scope of the appended claims. In addition, it is noted that, the Applicant's intent is to encompass equivalents of all claim elements, even if amended later during prosecution.

What is claimed is:

1. A lighting fixture, comprising:
   a bracket comprising:
   a chamber body configured for receiving at least one power module and defining at least one opening; and
   at least one cover configured for respectively sealing the at least one opening in the chamber body; and
   at least one light source module assembled on an inner side of the bracket;
   wherein the chamber body comprises at least one first fixing plate defining at least one sliding groove sunken inwards from a surface of the first fixing plate; the at least one sliding groove at least penetrates through a first side wall of the first fixing plate; a size of a groove opening is smaller than that of a groove bottom of each sliding groove; the first side wall of the first fixing plate is close to one of the at least one opening;
   wherein each power module comprises at least two fasteners and two flat plates each of which defines at least one first through hole configured for mounting one of at least two fasteners; the two flat plates extend outwards from the power module;
   wherein each fastener comprises a post and a cap connected at an end of the post, an outer diameter of the post is less than or equal to that of the groove opening of the sliding groove; a size of the cap is larger than the size of the groove opening and is smaller than the size of the groove bottom of the sliding groove, so that the cap can be received in the sliding groove; the at least one power module and the chamber body are connected together through the at least two fasteners which are inserted into the at least one sliding groove from the first side wall; the first fixing plate and the second fixing plates are in contact with each other.

2. The lighting fixture according to claim 1, wherein the power module is substantially shaped as a rectangular box; the two second fixing plates are configured on the power module and respectively extend outwards from two sides of a first outer wall of the power module; the second fixing plates and the first outer wall are substantially located in a same plane;

two notches penetrating through the edge of each second fixing plate are also formed in each second fixing plate; and the two notches are located at two sides of the first through hole.

3. The lighting fixture according to claim 2, wherein the post of each fastener comprises a screw part, and each fastener further comprises a nut which is matched with the screw part; the post of the fastener is inserted into the first through hole and is connected with the nut so as to be connected onto the power module.

4. The lighting fixture according to claim 3, wherein a thickness of a part with the sliding groove of the first fixing plate is greater than that of a part without the sliding groove; and the first fixing plate is made of a metal material.

5. The lighting fixture according to claim 3, wherein the chamber body has two openings defined in its opposite ends.

6. A power chamber configured for receiving at least one power module of a lighting fixture, comprising;

a chamber body substantially shaped as a rectangular box and defining two openings for the at least one power module to enter and exit; and at least one cover configured for respectively sealing the at least one opening;

wherein the chamber body comprises at least one first fixing plate each defining at least one sliding groove sunken inwards from a surface thereof;

wherein a size of a groove opening of the sliding groove is smaller than that of a groove bottom of the sliding groove; each sliding groove penetrates through two opposite side walls of the first fixing plate, so that the power module can be respectively fixed in the chamber body through the two openings;

wherein two or more fasteners are arranged on each power module; each fastener comprises a post and a cap connected at an end of the post, an outer diameter of the post is less than or equal to that of the groove opening of the sliding groove; a size of the cap is larger than the size of the groove opening and is smaller than the size of the groove bottom of the sliding groove, so that the cap can be received in the sliding groove; the at least one power module and the chamber body are connected together through the two or more fasteners which are inserted into the at least one sliding groove.

7. The power chamber according to claim 6, wherein a thickness of a part with the sliding groove of the first fixing plate is greater than that of a part without the sliding groove to improve thermal conductivity between the first fixing plate and the power module; and the first fixing plate is made of a metal material.

8. The power chamber according to claim 6, wherein the post of each fastener comprises a screw part, and each fastener further comprises a nut which is matched with the screw part; the post of the fastener is inserted into the first through hole and is connected with the nut so as to be connected onto the power module.

\* \* \* \* \*